(12) United States Patent
Dakshinamurthy et al.

(10) Patent No.: US 10,996,075 B2
(45) Date of Patent: May 4, 2021

(54) MICROELECTROMECHANICAL SYSTEMS (MEMS) GYROSCOPE CALIBRATION

(71) Applicant: INVENSENSE, INC., San Jose, CA (US)

(72) Inventors: Sriraman Dakshinamurthy, San Jose, CA (US); Doruk Senkal, San Jose, CA (US); Ali Shirvani, Menlo Park, CA (US); Ronak Chetan Desai, Santa Clara, CA (US); Carlo Pinna, Milan (IT)

(73) Assignee: INVENSENSE, INC., San Jose, CA (US)

( * ) Notice: Subject to any disclaimer, the term of this patent is extended or adjusted under 35 U.S.C. 154(b) by 327 days.

(21) Appl. No.: 16/221,409

(22) Filed: Dec. 14, 2018

(65) Prior Publication Data

US 2019/0186950 A1    Jun. 20, 2019

Related U.S. Application Data

(60) Provisional application No. 62/598,553, filed on Dec. 14, 2017.

(51) Int. Cl.
*G01C 25/00* (2006.01)
*B81B 3/00* (2006.01)
(Continued)

(52) U.S. Cl.
CPC .......... *G01C 25/005* (2013.01); *B81B 3/0018* (2013.01); *B81B 7/02* (2013.01); *G01C 19/56* (2013.01); *B81B 2201/0242* (2013.01)

(58) Field of Classification Search
CPC ........ G01C 25/005; G01C 19/56; B81B 7/02; B81B 2201/0242; B81B 3/0018
See application file for complete search history.

(56) References Cited

U.S. PATENT DOCUMENTS

| 2013/0121443 A1* | 5/2013 | Smith | H04L 27/364 |
| | | | 375/298 |
| 2013/0268228 A1* | 10/2013 | Opris | G01C 25/00 |
| | | | 702/104 |
| 2015/0192415 A1* | 7/2015 | Ge | G01C 19/5684 |
| | | | 73/504.13 |

OTHER PUBLICATIONS

Mohamed et al. ("A Novel Sample Based Quadrature Phase Shift Keying Demodulator," The Scientific World Journal, vol. 2014, Article ID 107831, pp. 1-7, 2014) (Year: 2014).*

(Continued)

*Primary Examiner* — Yasser A Abdelaziez
(74) *Attorney, Agent, or Firm* — Amin, Turocy & Watson, LLP

(57) ABSTRACT

Microelectromechanical systems (MEMS) gyroscopes and related measurement and calibration techniques are described. Various embodiments facilitate phase estimation of an ideal phase for a demodulator mixer associated with an exemplary MEMS gyroscope using quadrature tuning, which can improve offset performance over life time for exemplary MEMS gyroscopes. Exemplary embodiments can comprise adjusting a quadrature component of an exemplary MEMS gyroscope sense signal, measuring a change in offset of the exemplary MEMS gyroscope at an output of a demodulator mixer associated with the exemplary MEMS gyroscope, estimating a phase error between the quadrature component and a demodulation phase angle of the demodulator mixer based on the change in the offset, and periodically adjusting the demodulation phase angle of the demodulator mixer based on the phase error.

15 Claims, 7 Drawing Sheets

(51) Int. Cl.
 *B81B 7/02* (2006.01)
 *G01C 19/56* (2012.01)

(56) References Cited

OTHER PUBLICATIONS

Jia et al. ("Demodulation phase angle compensation for quadrature error in decoupled dual-mass MEMS gyroscope," J. Micro/Nanolith. MEMS MOEMS 17(3), 035001-1: 035001-13, Jul.-Sep. 2018) (Year: 2018).*

* cited by examiner

MICROELECTROMECHANICAL SYSTEMS (MEMS) GYROSCOPE CALIBRATION

PRIORITY CLAIM

This patent application is a Non-Provisional Application of U.S. Provisional Application Ser. No. 62/598,553, filed Dec. 14, 2017, entitled "PHASE ESTIMATION USING QUADRATURE TUNING," the entirety of which is incorporated by reference herein.

TECHNICAL FIELD

The disclosed subject matter relates to microelectromechanical systems (MEMS) gyroscopes and related measurement and calibration techniques.

BACKGROUND

Conventionally, microelectromechanical systems (MEMS) gyroscope require accurate trimming or adjusting to meet performance requirements such as sensitivity and offset accuracy. When a MEMS gyroscope is mounted on a customer's printed circuit board (PCB), the performance of the MEMS gyroscope, such as sensitivity and offset, has the potential to change. Moreover, when a MEMS gyroscope is subjected to environment variations such as temperature changes, package stresses, aging, and so on, the performance of the MEMS gyroscope has additional potential to change.

It is thus desired to provide MEMS gyroscope calibration techniques that improve upon these and other deficiencies. The above-described deficiencies of MEMS gyroscopes are merely intended to provide an overview of some of the problems of conventional implementations, and are not intended to be exhaustive. Other problems with conventional implementations and techniques and corresponding benefits of the various non-limiting embodiments described herein may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In various non-limiting embodiments of the disclosed subject matter, systems, devices, and methods for calibrating MEMS gyroscopes and related measurement techniques are described. For instance, exemplary non-limiting implementations provide apparatuses, systems, and methods that facilitate phase estimation of an ideal phase ($\varphi_{ideal}$) for a demodulator mixer associated with an exemplary MEMS gyroscope using quadrature tuning, which can improve offset performance over life time for exemplary MEMS gyroscopes.

Accordingly, exemplary embodiments can comprise adjusting a quadrature component of an exemplary MEMS gyroscope sense signal, such as by increasing or decreasing a voltage applied to the exemplary MEMS gyroscope. In addition, exemplary methods can further comprise measuring a change in offset of the exemplary MEMS gyroscope at an output of a demodulator mixer associated with the exemplary MEMS gyroscope and estimating a phase error between the quadrature component and a demodulation phase angle of the demodulator mixer based on the change in the offset. In addition, exemplary methods can comprise periodically adjusting the demodulation phase angle of the demodulator mixer based on the phase error.

Other non-limiting implementations of the disclosed subject matter provide exemplary systems and apparatuses directed to these and/or other aspects described herein.

BRIEF DESCRIPTION OF THE DRAWINGS

Various non-limiting embodiments are further described with reference to the accompanying drawings in which.

DETAILED DESCRIPTION

Overview

While a brief overview is provided, certain aspects of the disclosed subject matter are described or depicted herein for the purposes of illustration and not limitation. Thus, variations of the disclosed embodiments as suggested by the disclosed apparatuses, systems and methodologies are intended to be encompassed within the scope of the subject matter disclosed herein. For example, the various embodiments of the apparatuses, techniques and methods of the disclosed subject matter are described in the context of MEMS sensors such as MEMS gyroscopes and related calibration techniques. However, as further detailed below, various modifications can be made to the described techniques, without departing from the subject matter described herein.

Figure 1:
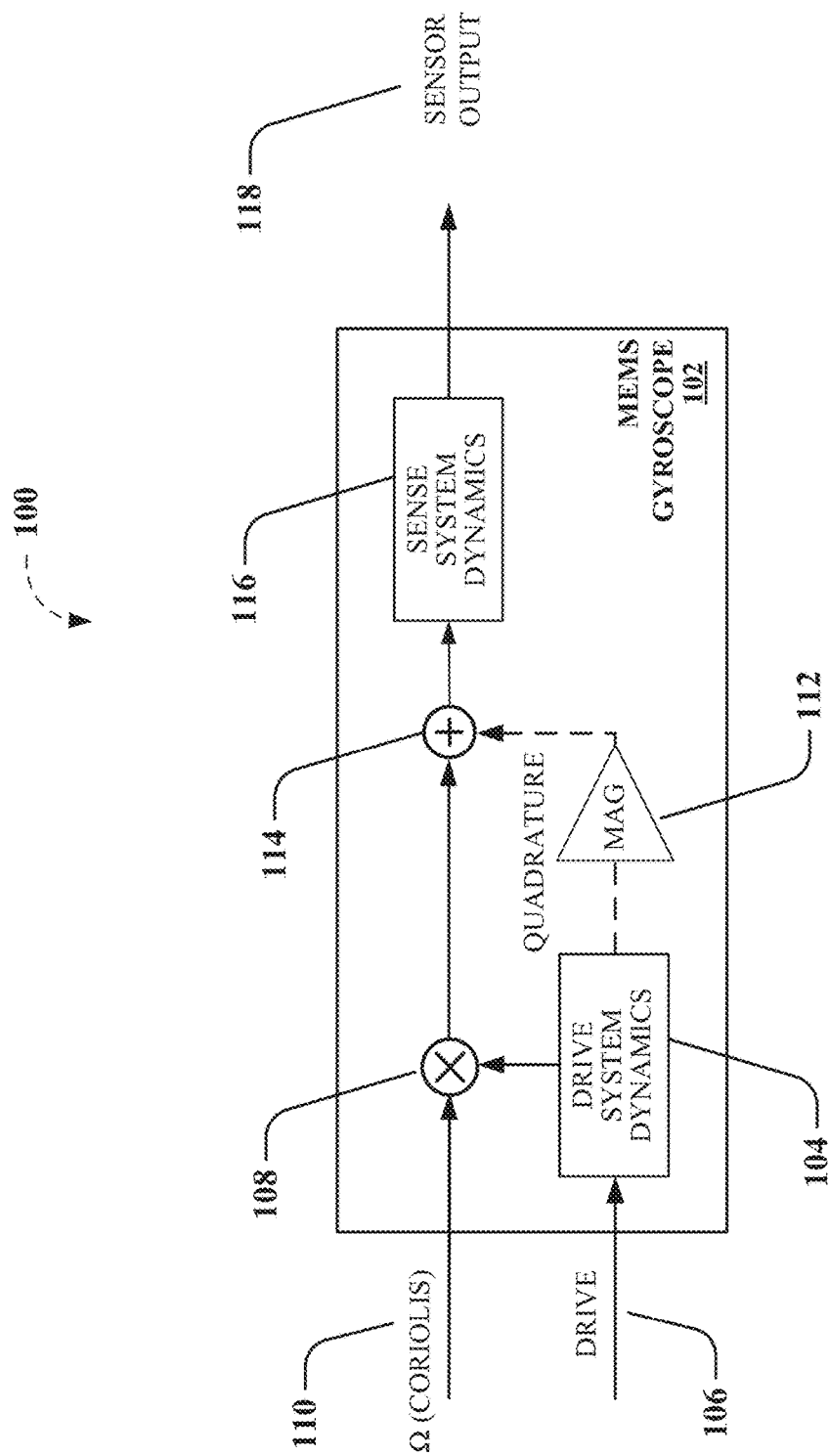
FIG. 1 depicts a non-limiting operating environment that illustrates a functional block diagram of an exemplary microelectromechanical systems (MEMS) gyroscope, in which various embodiments as described herein can be employed.

As described in the background, to maintain high performance of MEMS gyroscopes, it is thus desired to provide MEMS gyroscope calibration techniques that can measure small changes in offset and sensitivity and compensate for these changes over the lifetime of the MEMS gyroscopes. For instance, FIG. 1 depicts a non-limiting operating environment 100 that illustrates a functional block diagram of an exemplary MEMS gyroscope 102, in which various embodiments as described herein can be employed. Exemplary MEMS gyroscope 102 can comprise a drive subsystem 104 having a drive input signal 106. The exemplary MEMS gyroscope 102 is a passive element coupled to an active complementary metal oxide semiconductor (CMOS) element (not shown), which together form an oscillator, comprising a resonant mechanical device having a resonant frequency.

Figure 4:
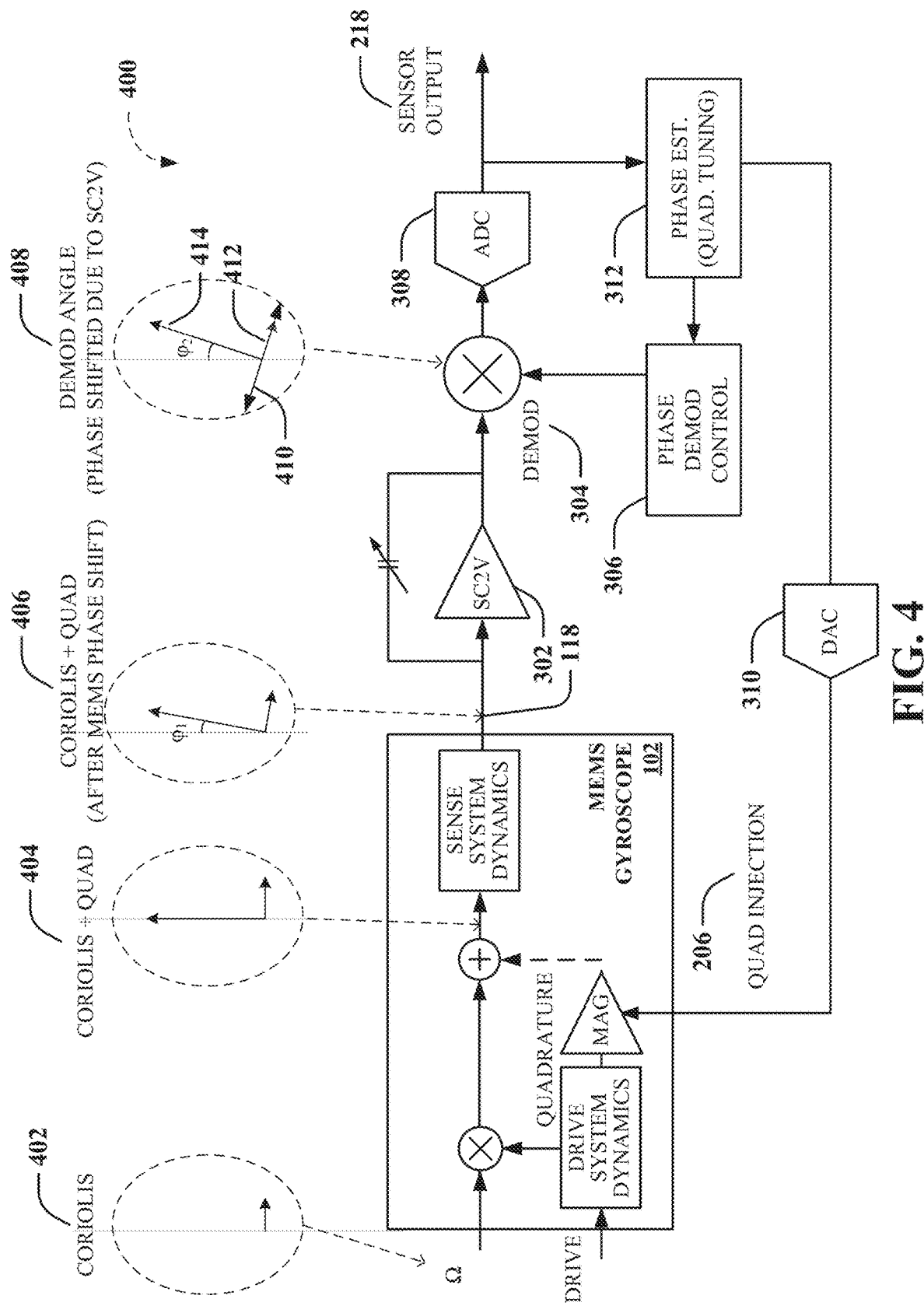
FIG. 4 depicts another functional block diagram of components of an exemplary system CMOS associated with exemplary MEMS gyroscope with relative phases of signals of interest, according to various aspects as described herein.

For example, if you apply the resonant frequency to the MEMS gyroscope 102, the output of the MEMS gyroscope 102 will be the resonant frequency, plus a 90° phase shift. Coupling the CMOS element (not shown) to the MEMS gyroscope 102 creates an oscillator that can be driven to establish a drive oscillation. The resulting drive input signal 106, as a result of drive subsystem 104, produces a velocity vector which is modulated 108, with the incoming Coriolis signal 110, which is depicted in FIG. 4 as the vector on the reference X-axis (CORIOLIS 402), as further described below. The velocity multiplied by the incoming Coriolis signal 110 is the signal of interest in exemplary MEMS gyroscope 102.

A leakage component of drive subsystem 104, represented as a dotted line, is an undesired and potentially unknown component referred to herein as a quadrature component, which is shown by the variable magnitude 112 block, and which is a representation of the displacement of the drive mechanism. The quadrature components sums 114 into the sense path, comprising the Coriolis signal 110 modulated 108 by the velocity vector, with a 90° offset, which is depicted in FIG. 4 as the vector on the y-axis (CORIOLIS+QUAD 404), as further described below.

Exemplary MEMS gyroscope 102 can further comprise a sense subsystem 116 having its own resonance, which is depicted functionally as receiving this summed 114 signal (CORIOLIS+QUAD), which, among other phenomena, causes a phase shift $\varphi_1$, which is depicted in FIG. 4 as a phase rotation of the signals (CORIOLIS+QUAD (AFTER MEMS PHASE SHIFT) 406), or sensor output 118, as further described below. For instance, exemplary MEMS gyroscope 102 can comprise one or more sense electrodes (not shown) configured to sense a Coriolis 110 component, which is the desired signal of the sense electrode(s). The quadrature signal is an undesired signal present as a result of small misalignments or mechanical tilts in the MEMS gyroscope 102 drive subsystem 104 during the MEMS gyroscope 102 drive mechanism oscillations.

Thus, the output signal 118 of an exemplary MEMS gyroscope 102 is a result of two phenomena. One, a displacement or position vector of the MEMS gyroscope 102 element is a sine wave. And two, velocity of the MEMS gyroscope 102 element is a derivative of position vector, which is a cosine wave, which is 90° out of phase from the displacement or position vector. As described, the velocity of the MEMS gyroscope 102 element will modulate any Coriolis signal 110 applied to the MEMS gyroscope 102, and the output can be sensed through the sense path. Any quadrature that is present in the MEMS gyroscope 102 will be modulated by the position vector and summed with the Coriolis signal 110 modulated 108 by the velocity vector (CORIOLIS+QUAD).

Because of this property, the output of the MEMS gyroscope 102 will have two fundamental signal components. One is the quadrature component, which is modulated by the position vector. And the other is the Coriolis component, which is modulated by the velocity vector. When a MEMS gyroscope 102 is trimmed in the factory (e.g., by adding an offset), special attention is made to align the demodulation phase or demod phase of the CMOS, which is a parameter that represents an angle, such that it aligns orthogonally to the quadrature component coming from the MEMS gyroscope 102, as further described below. Ideally, the quadrature component is a quasi-static signal (e.g., sine wave of fixed amplitude), which when demodulated appears as a fixed offset. So long as the quadrature component does not vary in phase or amplitude, the known quadrature component can be trimmed in the factory (e.g., by adding an offset). Thus, to maintain high performance of MEMS gyroscope 102, the demod phase of the demodulator should be 90° away from the quadrature component.

However, as described above, when a MEMS gyroscope 102 is mounted on a customer's printed circuit board (PCB), the performance of the MEMS gyroscope 102, such as sensitivity and offset, has the potential to change. Moreover, when a MEMS gyroscope 102 is subjected to environment variations such as temperature changes, package stresses, aging, and so on, the performance of the MEMS gyroscope 102 has additional potential to change.

EXEMPLARY EMBODIMENTS

For example, the offset of a MEMS gyroscope 102 can vary over the life of the MEMS gyroscope 102 due to stress or temperature variation. The root cause of such offset variation can be a result of an interaction between a MEMS gyroscope 102 quadrature component, together with a CMOS component of a CMOS associated with the MEMS gyroscope 102 called demod phase or demodulation phase, as further described FIG. 4. As described, when a MEMS gyroscope 102 is trimmed in the factory (e.g., by adding an offset), special attention is paid to align the demodulation phase or demod phase, which is a parameter that represents an angle, such that it aligns orthogonally to the quadrature component coming from the MEMS gyroscope 102. That is, to maintain high performance of MEMS gyroscope 102, that demod phase should be 90° away from the quadrature component.

As further described, the quadrature component in the MEMS is an undesired signal that is injected into the sense path of the MEMS gyroscope 102 as a result of small misalignments or mechanical tilts in the MEMS drive mechanism oscillations. The quadrature component is typically a sine wave signal that is orthogonal (or 90° out of phase) to the Coriolis signal, which is the signal of interest. During stress and life time variations, the relative phase of the quadrature can vary with respect to the demodulation phase or demod phase.

Figure 2:
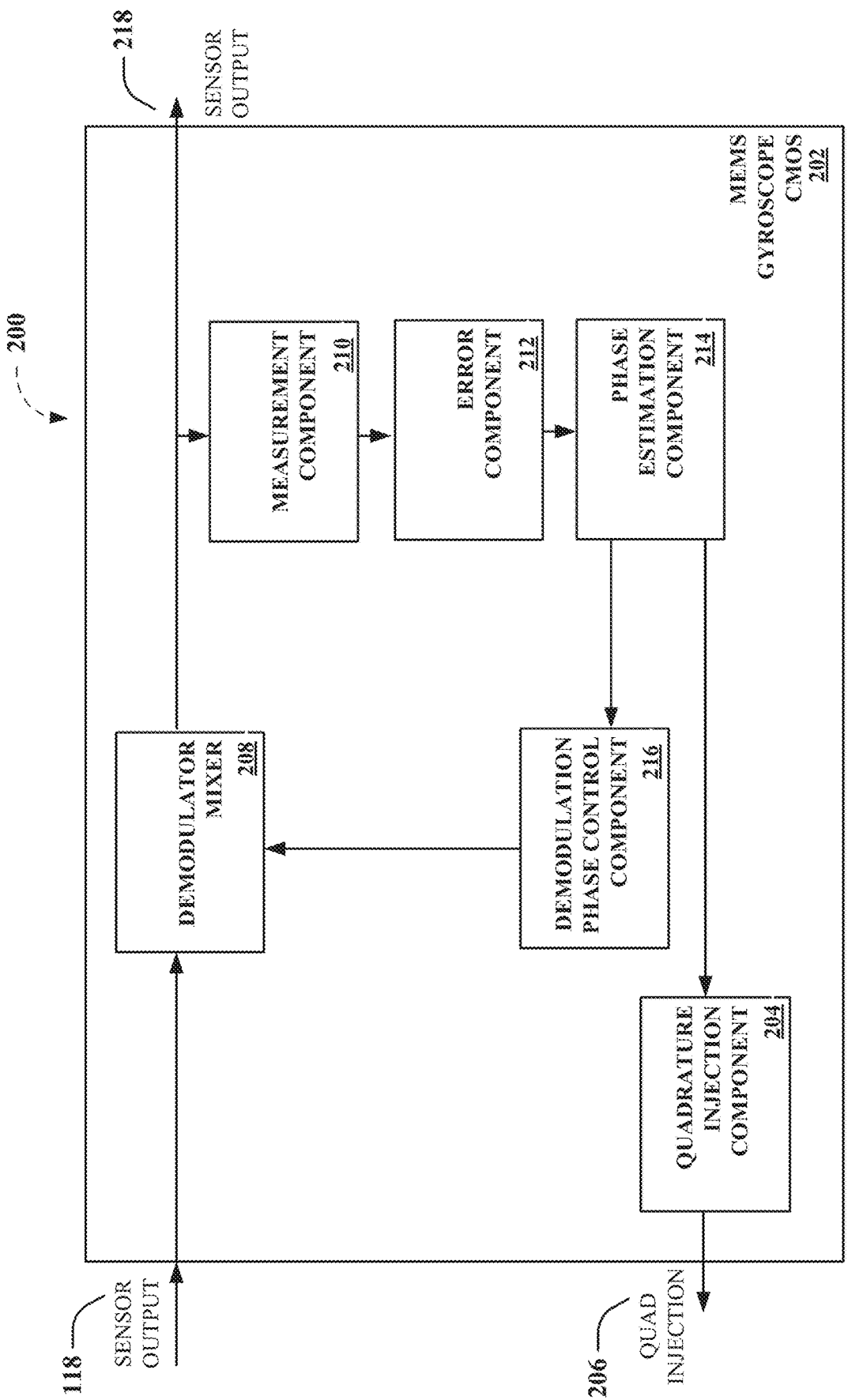
FIG. 2 depicts a functional block diagram of an exemplary system complementary metal oxide semiconductor (CMOS) associated with an exemplary MEMS gyroscope for phase estimation using non-limiting aspects of quadrature tuning, as described herein.

Various embodiments described herein provide processes by which the angle error between the quadrature and the demod phase can be remeasured and a correction applied to the trim value of demod phase, as further described herein. That is, by measuring the angle error between the quadrature and the demod phase and adjusting the value of the demod phase, various embodiments can facilitate decoding only the Coriolis signal, while suppressing a rejecting the quadrature signal, as further described herein For example, FIG. 2 depicts a functional block diagram 200 of an exemplary MEMS gyroscope 102 CMOS 202 associated with exemplary MEMS gyroscope 102 for phase estimation using non-limiting aspects of quadrature tuning, as described herein. Various non-limiting embodiments as described herein can comprise the ability to change the magnitude of the leakage component (e.g., quadrature component) of drive subsystem 104, represented as a dotted line in FIG. 1, which, being a potentially unknown component is shown by the variable magnitude 112 block. According to non-limiting aspects, an exemplary MEMS gyroscope 102 CMOS 202 can comprise an exemplary quadrature injection component 204 configured to adjust a quadrature component (e.g., quad injection 206) of a MEMS gyroscope 102 sense signal, for example, as further described herein, regarding FIGS. 3-6. In a non-limiting aspect, exemplary embodiments of a quadrature injection component 204 can be further configured to increase or decrease a voltage applied to exemplary MEMS gyroscope 102 (e.g., a quadrature injection port associated with exemplary MEMS gyroscope 102).

In addition, exemplary MEMS gyroscope CMOS 202 associated with exemplary MEMS gyroscope 102 can comprise a measurement component 210 configured to measure a change in offset of the MEMS gyroscope 102 at an output of a demodulator mixer 208 associated with the MEMS gyroscope 102, for example, as further described herein, regarding FIGS. 3-6. Exemplary MEMS gyroscope CMOS 202 associated with exemplary MEMS gyroscope 102 can further comprise an error component 212 configured to estimate a phase error between the quadrature component and a demodulation phase angle of the demodulator mixer 208 based on the change in the offset, for example, as further described herein, regarding FIGS. 3-6.

Exemplary MEMS gyroscope CMOS 202 associated with exemplary MEMS gyroscope 102 can further comprise a demodulation phase control component 216 configured to periodically adjust the demodulation phase angle of the demodulator mixer 208 based on the phase error, for example, as further described herein, regarding FIGS. 3-6. As a non-limiting example, exemplary demodulation phase control component 216 can be further configured to trim the demodulation phase angle based on a demodulation phase angle estimation at the output of the demodulation mixer that results in an approximately zero change in offset, wherein the demodulation phase angle estimation is within a predetermined variation of demodulation phase angle for the MEMS gyroscope 102, for example, as further described herein, regarding FIGS. 3-6.

In addition, exemplary MEMS gyroscope CMOS 202 associated with exemplary MEMS gyroscope 102 can comprise a phase estimation component 214 configured to determine the demodulation phase angle estimation at the output of the demodulation mixer that results in the approximately zero change in offset, for example, as further described herein, regarding FIGS. 3-6.

Figure 3:
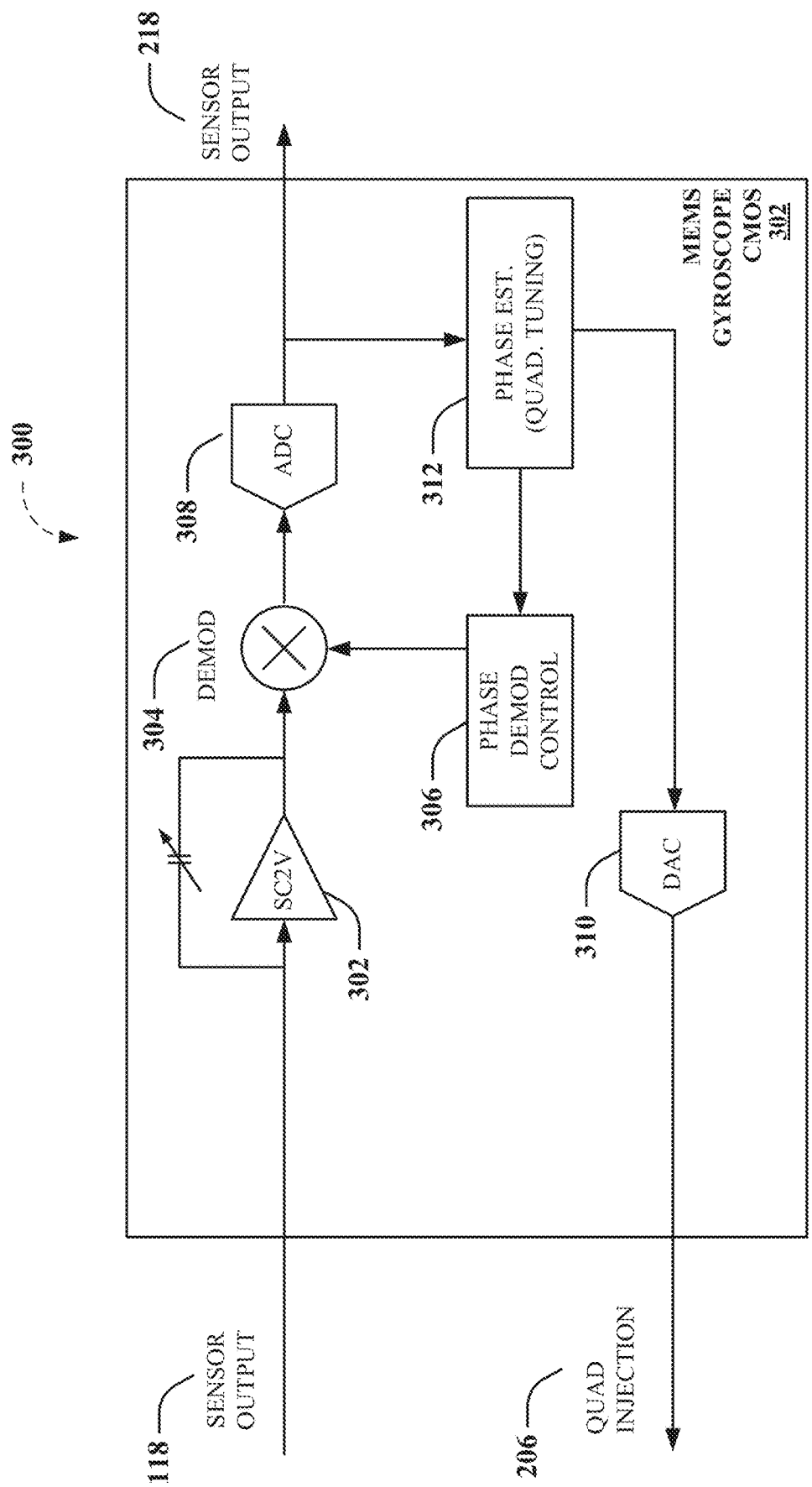
FIG. 3 depicts another functional block diagram of an exemplary system CMOS associated with exemplary MEMS gyroscope for phase estimation using non-limiting aspects of quadrature tuning, as described herein.

FIG. 3 depicts another functional block diagram 300 of an exemplary system CMOS 302 associated with exemplary MEMS gyroscope 102 for phase estimation using non-limiting aspects of quadrature tuning, as described herein. According to various non-limiting embodiments, sensor output 118 can be communicatively coupled to exemplary MEMS gyroscope 102 CMOS 302 CMOS amplifier comprising sense subsystem capacitance to voltage converter (SC2V) 302, which is an active circuit, the output of which can provide a scaled version of the input plus phase shift $\varphi_2 = \varphi_1 + \varphi_{SC2V}$, which is depicted in FIG. 4 as a phase rotation of the signals (DEMOD ANGLE (PHASE SHIFTED DUE TO SC2V) 408), as further described below.

According to further non-limiting embodiments, exemplary MEMS gyroscope CMOS 302 can comprise demodulator mixer or demod 304 that can be configured to multiply a reference sine wave (not shown) with the sense sine wave (e.g., output of SC2V 302), the phase of which reference sine wave can be controlled by the phase demodulation control or demod control 306, as further described herein. In further non-limiting embodiments, the resulting signal can be downconverted (not shown) and processed via analog to digital converter (ADC) 308, before being processed via an additional one or more filters (not shown) prior to being passed as sensor output 218.

As further described above, various non-limiting embodiments as described herein can comprise the ability to change the magnitude of the leakage component (e.g., quadrature component) of drive subsystem 104, represented as a dotted line in FIG. 1, which, being a potentially unknown component is shown by the variable magnitude 112 block. According to non-limiting aspects, an exemplary MEMS gyroscope 102 CMOS 202 can comprise an exemplary quadrature injection component 204 configured to adjust a quadrature component (e.g., quad injection 206) of a MEMS gyroscope 102 sense signal, for example, as further described herein, regarding FIGS. 3-4. In a non-limiting aspect, exemplary embodiments of a quadrature injection component 204 can be further configured to increase or decrease a voltage applied to exemplary MEMS gyroscope 102 (e.g., a quadrature injection port associated with exemplary MEMS gyroscope 102). Thus, exemplary MEMS gyroscope 102 CMOS 302 can comprise an exemplary digital to analog converter (DAC) 310 and/or one or more other components configured to adjust a quadrature component (e.g., quad injection 206) of a MEMS gyroscope 102 sense signal, for example, as further described herein, regarding FIGS. 2, 4, etc.

Figure 5:
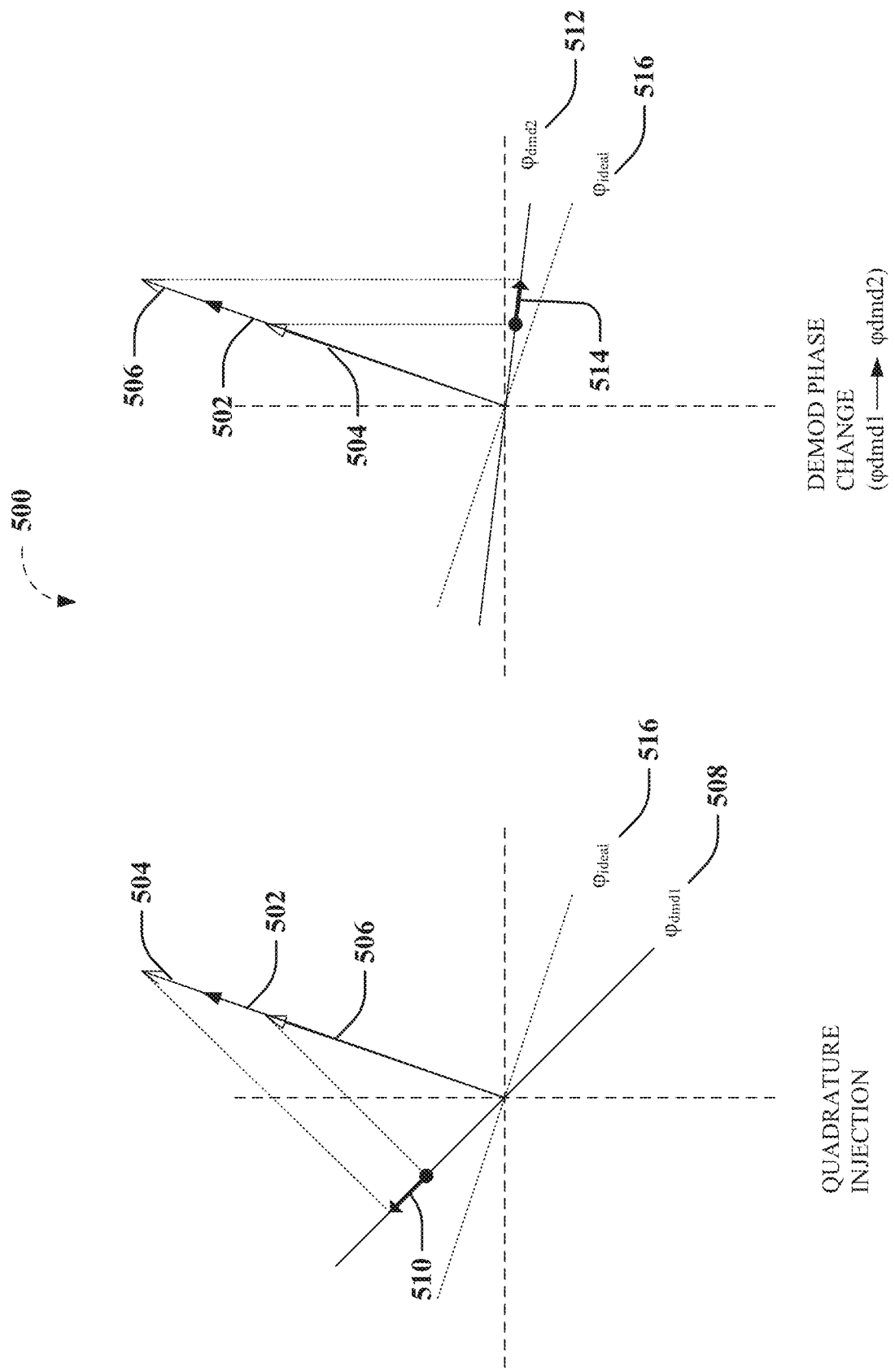
FIG. 5 depicts exemplary vector diagrams illustrating non-limiting aspects of exemplary quadrature injection measurement and phase estimation employing quadrature tuning, according to non-limiting embodiments described herein.
Figure 6:
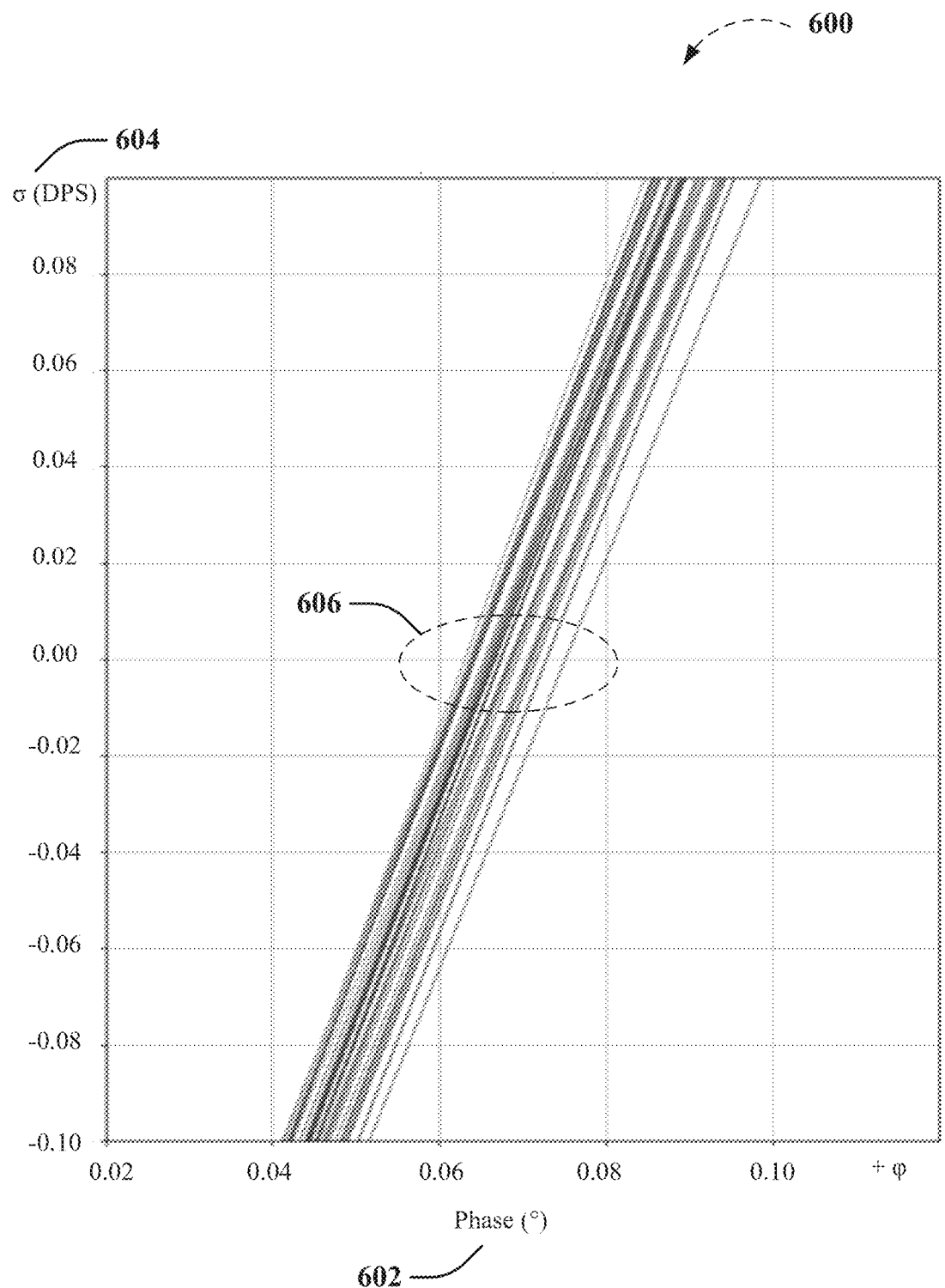
FIG. 6 plots an exemplary relation of phase of demodulator mixer to detected output vector for different quadrature injection states, according to various aspects described herein.

According to further non-limiting embodiments, exemplary MEMS gyroscope CMOS 302 can further comprise exemplary phase demodulation control or demod control components 306 and exemplary phase estimation/quadrature tuning components 312, as further described herein, regarding FIGS. 5-6, for example. As a non-limiting example, an exemplary phase estimation/quadrature tuning components 312 can be configured to estimate the demodulation phase angle at the output of the demodulator mixer or demod 304 that results in an approximately zero change in offset. In another non-limiting example, an exemplary phase demodulation control or demod control components 306 can be configured to periodically adjust the demodulation phase angle of the demodulator mixer or demod 304 based on the phase error or the estimate of the demodulation phase angle to facilitate the demodulator mixer or demod 304 outputting the Coriolis signal of the MEMS gyroscope 102 and to suppress the quadrature signal of the MEMS gyroscope 102, as further described herein.

In further non-limiting embodiments, exemplary gyroscope systems can comprise, an exemplary MEMS gyroscope 102 configured to receive an injected quadrature signal (e.g., quad injection 206), for example, as further described herein, regarding FIGS. 2-6. In addition, exemplary gyroscope systems can comprise electrical circuitry (e.g. quadrature injection component 204, portions thereof, DAC 310, etc.) communicatively coupled to the exemplary MEMS gyroscope 102 configured to generate the injected quadrature signal (e.g., quad injection 206), for example, as further described herein, regarding FIGS. 2-6. As a non-limiting example, electrical circuitry configured to generate the injected quadrature signal (e.g., quad injection 206) can be further configured to adjust the injected quadrature signal (e.g., quad injection 206) by increasing or decreasing a voltage applied to the exemplary MEMS gyroscope 102, for example, as further described herein, regarding FIGS. 2-6, according to various non-limiting aspects described herein.

Exemplary gyroscope systems can further comprise a signal path associate with the exemplary MEMS gyroscope 102 configured to generate a demodulated component of the injected quadrature signal (e.g., quad injection 206), for example, as further described herein, regarding FIGS. 2-6. In addition, exemplary gyroscope systems can comprise electrical circuitry (e.g., measurement component 210, phase estimation/quadrature tuning 312 portions thereof, etc.) associated with the signal path that is configured to measure a change in an output of the signal path in response to the injected quadrature signal (e.g., quad injection 206), for example, as further described herein, regarding FIGS. 2-6. As a non-limiting example, the change in the output of the signal path can comprise a change in an average value of the output, for example, as further described herein, regarding FIGS. 2-6, according to various non-limiting aspects described herein. In a further non-limiting example, electrical circuitry (e.g., error component 212, phase estimation/quadrature tuning 312 portions thereof, etc.) associated with the signal path can comprise a phase error estimation component configured to estimate a phase error between the injected quadrature signal (e.g., quad injection 206) and the demodulated component, for example, as further described herein, regarding FIGS. 2-6, according to various non-limiting aspects described herein.

In addition, exemplary gyroscope systems can comprise a demodulation phase control component (e.g., demodulation phase control component 216, phase demodulation control or demod control 306, etc.) configured to periodically adjust the demodulation phase angle of the output based on the injected quadrature signal (e.g., quad injection 206), for example, as further described herein, regarding FIGS. 2-6.

FIG. 4 depicts another functional block diagram 400 of components of an exemplary system CMOS 302 associated with exemplary MEMS gyroscope 102 with relative phases of signals of interest, according to various aspects as described herein. As described above regarding FIG. 1, the resulting drive input signal 106, as a result of drive subsystem 104, produces a velocity vector which is modulated 108, with the incoming Coriolis signal 110, which is depicted in FIG. 4 as the vector on the reference X-axis (CORIOLIS 402). The velocity multiplied by the incoming Coriolis signal 110 is the signal of interest in exemplary MEMS gyroscope 102.

A leakage component of drive subsystem 104, represented as a dotted line, is an undesired and potentially unknown component referred to herein as a quadrature component, which is shown by the variable magnitude 112 block, and which is a representation of the displacement of the drive mechanism. The quadrature components sums 114 into the sense path, comprising the Coriolis signal 110 modulated 108 by the velocity vector, with a 90° offset, which is depicted in FIG. 4 as the vector on the y-axis (CORIOLIS+QUAD 404). Exemplary MEMS gyroscope 102 can further comprise a sense subsystem 116 having its own resonance, which is depicted functionally as receiving this summed 114 signal (CORIOLIS+QUAD), which, among other phenomena, causes a phase shift $\varphi_1$, which is depicted in FIG. 4 as a phase rotation of the signals (CORIOLIS+QUAD (AFTER MEMS PHASE SHIFT) 406), or sensor output 118.

According to various non-limiting embodiments, sensor output 118 can be communicatively coupled to a CMOS amplifier (e.g. exemplary MEMS gyroscope CMOS 302 CMOS amplifier 302) comprising SC2V 302, which is an active circuit, the output of which can provide a scaled version of the input plus phase shift $\varphi_2 = \varphi_1 + \varphi_{SC2V}$, which is depicted in FIG. 4 as a phase rotation of the signals (DEMOD ANGLE (PHASE SHIFTED DUE TO SC2V) 408).

As described above, exemplary MEMS gyroscope CMOS 302 can comprise demodulator mixer or demod 304 that can be configured to multiply a reference sine wave (not shown) with the sense sine wave (e.g., output of SC2V 302 or DEMOD ANGLE (PHASE SHIFTED DUE TO SC2V) 408), the phase of which reference sine wave can be controlled by the phase demodulation control or demod control 306, wherein the phase vector 410 represents the phase of the reference sine wave as the second input controlled by the phase demodulation control or demod control 306. In various embodiments, as long as the phase vector 410 represents the phase of the reference sine wave as the second input controlled by the phase demodulation control or demod control 306 is aligned with the phase vector 412, representing the Coriolis axis, the output of the demodulator mixer or demod 304 will comprise the Coriolis signal 412, while rejecting or suppressing the undesired quadrature component, represented by phase vector 414.

As further described above, various non-limiting embodiments as described herein can comprise the ability to change the magnitude of the leakage component (e.g., quadrature component) of drive subsystem 104, represented as a dotted line in FIG. 1, which, being a potentially unknown component is shown by the variable magnitude 112 block. According to non-limiting aspects, an exemplary MEMS gyroscope CMOS 202 can comprise an exemplary quadrature injection component 204 configured to adjust a quadrature component (e.g., quad injection 206) of a MEMS gyroscope 102 sense signal, for example, as further described herein, regarding FIGS. 3-4. In a non-limiting aspect, exemplary embodiments of a quadrature injection component 204 can be further configured to increase or decrease a voltage applied to exemplary MEMS gyroscope 102 (e.g., a quadrature injection port associated with exemplary MEMS gyroscope 102). Thus, exemplary MEMS gyroscope CMOS 302 can comprise an exemplary digital to analog converter (DAC) 310 and/or one or more other components configured to to adjust a quadrature component (e.g., quad injection 206) of a MEMS gyroscope 102 sense signal, for example, as further described herein, regarding FIGS. 2-3, etc.

According to further non-limiting embodiments, exemplary MEMS gyroscope CMOS 302 can further comprise exemplary phase demodulation control or demod control components 306 and exemplary phase estimation/quadrature tuning components 312, as further described herein, regarding FIGS. 5-6, for example. As a non-limiting example, an exemplary exemplary phase estimation/quadrature tuning components 312 can be configured to estimate the demodulation phase angle at the output of the demodulator mixer or demod 304 that results in an approximately zero change in offset. In another non-limiting example, an exemplary phase demodulation control or demod control components 306 can be configured to periodically adjust the demodulation phase angle of the demodulator mixer or demod 304 based on the phase error or the estimate of the demodulation phase angle to facilitate the demodulator mixer or demod 304 outputting the Coriolis signal of the MEMS gyroscope 102 and to suppress the quadrature signal of the MEMS gyroscope 102, as further described herein.

Accordingly, various embodiments described herein can comprise exemplary gyroscope systems, which can comprise an exemplary MEMS gyroscope 102. As further described herein, exemplary managers 102 can be configured to receive a quadrature injection 206 signal (e.g., via a quadrature injection port, etc.), for example, as further described herein, regarding FIGS. 1-6. Exemplary gyroscope systems can further comprise an exemplary CMOS (e.g., exemplary MEMS gyroscope 102 CMOS 202, exemplary MEMS gyroscope 102 CMOS 202, etc.) associated with the exemplary MEMS gyroscope 102, for example, as further described herein, regarding FIGS. 1-6.

Exemplary gyroscope systems can further comprise an exemplary quadrature injection component (e.g., quadrature injection component 204, DAC 310, etc.) configured to adjust a quadrature component of a sense signal of the exemplary MEMS gyroscope 102, for example, as further described herein, regarding FIGS. 1-6. As a non-limiting example, exemplary quadrature injection component (e.g., quadrature injection component 204, DAC 310, etc.) can be further configured to increase or decrease a voltage applied to the exemplary MEMS gyroscope 102, according to various non-limiting aspects described herein.

Exemplary gyroscope systems can further comprise an exemplary demodulator mixer (e.g., demodulator mixer 208, demodulator mixer or demod 304, etc.) of the CMOS configured to output a Coriolis signal of the exemplary MEMS gyroscope 102 and suppress the quadrature component of the sense signal of the exemplary MEMS gyroscope 102, for example, as further described herein, regarding FIGS. 1-6.

In addition, exemplary gyroscope systems can comprise an exemplary measurement component (e.g., measurement component 210, phase estimation/quadrature tuning 312, portions thereof, etc.) of the CMOS configured to measure a change in offset of the exemplary MEMS gyroscope 102 at an output of the demodulator mixer (e.g., demodulator mixer 208, demodulator mixer or demod 304, etc.), for example, as further described herein, regarding FIGS. 1-6.

Exemplary gyroscope systems can further comprise an exemplary error component (e.g., error component 212, phase estimation/quadrature tuning 312, portions thereof, etc.) configured to estimate a phase error between the quadrature component and a demodulation phase angle of the demodulator mixer (e.g., demodulator mixer 208, demodulator mixer or demod 304, etc.) based on the change in the offset, for example, as further described herein, regarding FIGS. 1-6. In addition, exemplary gyroscope systems can comprise an exemplary phase estimation component (e.g., phase estimation component 214, phase estimation/quadrature tuning 312, portions thereof, etc.) configured to estimate the demodulation phase angle at the output of the demodulator mixer (e.g., demodulator mixer 208, demodulator mixer or demod 304, etc.) that results in an approximately zero change in offset, for example, as further described herein, regarding FIGS. 1-6.

Exemplary gyroscope systems can further comprise an exemplary demodulation phase control component (e.g., demodulation phase control component 216, phase demodulation control or demod control 306, portions thereof, etc.) configured to periodically adjust the demodulation phase angle of the demodulator mixer (e.g., demodulator mixer 208, demodulator mixer or demod 304, etc.) based on the phase error or the estimate of the demodulation phase angle to output the Coriolis signal of the exemplary MEMS gyroscope 102 and to suppress the quadrature signal of the exemplary MEMS gyroscope 102, for example, as further described herein, regarding FIGS. 1-6. As a non-limiting example, an estimate of the demodulation phase angle at the output of the demodulator mixer (e.g., demodulator mixer 208, demodulator mixer or demod 304, etc.) is within a predetermined variation of demodulation phase angle for the exemplary MEMS gyroscope 102, for example, as further described herein, regarding FIGS. 1-6, according to various non-limiting aspects described herein.

In other non-limiting implementations, exemplary apparatuses can comprise, means for adjusting a quadrature component of a microelectromechanical systems (MEMS) gyroscope sense signal, for example, as further described herein, regarding FIGS. 1-6. As a non-limiting example, means for adjusting the quadrature component of the MEMS gyroscope sense signal comprises means for increasing or decreasing a voltage applied to the MEMS gyroscope, for example, as further described herein, regarding FIGS. 1-6, according to various non-limiting aspects described herein.

Exemplary apparatuses can further comprise means for measuring a change in offset of the MEMS gyroscope at an output of a demodulator mixer associated with the MEMS gyroscope, for example, as further described herein, regarding FIGS. 1-6. In addition, exemplary apparatuses can comprise means for estimating a phase error between the quadrature component and a demodulation phase angle of the demodulator mixer associated with the MEMS gyroscope based at least in part on the change in the offset, for example, as further described herein, regarding FIGS. 1-6.

Exemplary apparatuses can further comprise means for periodically adjusting the demodulation phase angle of the demodulator mixer based at least in part on the phase error, for example, as further described herein, regarding FIGS. 1-6. As a non-limiting example, means for periodically adjusting the demodulation phase angle of the demodulator mixer comprises means for trimming the demodulation phase angle based on a demodulation phase angle estimation at the output of the demodulation mixer that results in an approximately zero change in offset, wherein the demodulation phase angle estimation is within a predetermined variation of demodulation phase angle for the MEMS gyroscope, for example, as further described herein, regarding FIGS. 1-6, according to various non-limiting aspects described herein.

FIG. 5 depicts exemplary vector diagrams illustrating non-limiting aspects of exemplary quadrature injection measurement and phase estimation employing quadrature tuning, according to non-limiting embodiments described herein. For instance, FIG. 5 illustrates the nominal condition of quadrature 502 (solid arrowhead) that is naturally occurring inside an exemplary MEMS gyroscope 102. By manipulating the voltage (quadrature injection 206) applied to the exemplary MEMS gyroscope 102, the amplitude of the quadrature component can be increased 504 (skeleton arrowhead), or decreased 506 (unfilled arrowhead). FIG. 5 further illustrates phase of the reference to the demodulator mixer or demod 304 ($\varphi_{dmd1}$ 508) or current demod phase of the demodulator mixer or demod 304. In addition, FIG. 5 illustrates a vector 510 of the projection of the different states of the quadrature injection (e.g., increased 504 (skeleton arrowhead) and decreased 506 (unfilled arrowhead)) along the line of the phase of the reference to the demodulator mixer or demod 304 ($\varphi_{dmd1}$ 508), which represents the output of the exemplary MEMS gyroscope 102 at the different quadrature injection states. Note the vector 510 has a certain polarity and a certain amplitude, along the line of the phase of the reference to the demodulator mixer or demod 304 ($\varphi_{dmd1}$ 508).

FIG. 5 further illustrates a change of phase of the reference to the demodulator mixer or demod 304 (or a phase change from $\varphi_{dmd1}$ 508 to $\varphi_{dmd2}$ 512) for the demod phase of the demodulator mixer or demod 304 and a vector 514 of the projection of the different states of the quadrature injection (e.g., increased 504 (skeleton arrowhead) and decreased 506 (unfilled arrowhead)) along the line of the phase of the reference to the demodulator mixer or demod 304 ($\varphi_{dmd2}$ 512), which represents the output of the exemplary MEMS gyroscope 102 at the different quadrature injection states or offset.

Note the vector 514 has a certain polarity and a certain amplitude, opposite in direction to that of vector 510, along the line of the phase of the reference to the demodulator mixer or demod 304 ($\varphi_{dmd2}$ 512). That is, even though the states of the quadrature injection 206 are the same, the polarity of the projected vector along the line of the phase of the reference to the demodulator mixer or demod 304 ($\varphi_{dmd1}$ 508 or $\varphi_{dmd2}$ 512) (e.g., from vector 510 to vector 514) switches from a positive polarity to a negative polarity. In other words, when the polarity of the projected vector along the line of the phase of the reference to the demodulator mixer or demod 304 ($\varphi_{dmd1}$ 508 or $\varphi_{dmd2}$ 512) (e.g., from vector 510 to vector 514) switches from a positive polarity to a negative polarity, the change in offset resulting from the different states of the quadrature injection (e.g., increased 504 (skeleton arrowhead) and decreased 506 (unfilled arrowhead)) along the line of the phase of the reference to the demodulator mixer or demod 304 ($\varphi_{dmd1}$ 508 or $\varphi_{dmd2}$ 512) is expected to be zero in the ideal case (e.g., not allowing for device or measurement variations or inaccuracies).

Accordingly, various embodiments as described herein can employ detection of the switch in polarity of the projected vector to detect phase of the quadrature at the point at which the projection switches polarity (e.g., corresponding to $\varphi_{ideal}$ 516). For instance, when the phase of demodulator mixer or demod 304 ($\varphi_{dmd1}$ 508 or $\varphi_{dmd2}$ 512) is aligned $\varphi_{ideal}$ 516, then projection of the quadrature injection to the phase of demodulator mixer or demod 304 ($\varphi_{dmd1}$ 508 or $\varphi_{dmd2}$ 512) will be zero, for example, as further described below regarding FIG. 6.

FIG. 6 plots an exemplary relation 600 of phase of demodulator mixer to detected output vector for different quadature injection states, according to various aspects described herein. For instance, exemplary relation 600 is a plot of phase 602 of demodulator mixer or demod 304 (e.g., $\varphi_{dmd1}$ 508, $\varphi_{dmd2}$ 512, etc.) swept across various phase of demodulator mixer or demod 304 on the x-axis in degrees, where y-axis is the difference 604 in the detected output vector (e.g., vector 510, vector 514) at the different quadrature injection states in degrees/second (DPS).

FIG. 6 represents a series of different runs for the same operation. Note that the relation where it crosses zero on the y-axis corresponds to a collection 606 of points centered on about φ+0.07, corresponding to an estimate of $\varphi_{ideal}$ 516, and having some variation of $\varphi_{MEMS}$ (e.g., $\varphi_{ideal}$ 516), where as described above regarding FIG. 5, would result in the quadrature component and the phase of demodulator mixer or demod 304 (e.g., $\varphi_{dmd1}$ 508 or $\varphi_{dmd2}$ 512) being 90° out of phase, despite any changes in offset due to stresses or other factors that occur post trimming of the MEMS gyroscope 102 at the factory.

Accordingly, various embodiments as described herein can comprise a phase estimation component (e.g., phase estimation component 214, phase estimation/quadrature tuning component 312) that can be configured to estimate the demodulation phase angle (e.g., $\varphi_{ideal}$) at the output of the demodulator mixer or demod 304 that results in an approximately zero change in offset.

Thus, an exemplary process for estimating the demodulation phase angle (e.g., $\varphi_{ideal}$) at the output of the demodulator mixer or demod 304 that results in an approximately zero change in offset can comprise periodically adjusting the demodulation phase angle of the demodulator mixer or demod 304 by trimming the demodulation phase angle based on a demodulation phase angle estimation (e.g., via exemplary phase estimation component 214, phase estimation/quadrature tuning component 312, etc.) at the output of the demodulator mixer or demod 304 that results in an approximately zero change in offset, as described above regarding FIGS. 5 and 6, wherein the demodulation phase angle estimation is within a predetermined variation of demodulation phase angle for the MEMS gyroscope 102, for example, as depicted in FIG. 6.

Accordingly, an exemplary phase estimation process as described herein can comprise, measuring offset of exemplary MEMS gyroscope 102 with a first value of quadrature injection 206, measuring offset of exemplary MEMS gyroscope 102 with a second value of quadrature injection 206, and calculating the corresponding offset changes for a range of demodulation phases of the demodulator mixer or demod 304, estimating $\varphi_{ideal}$ as the best phase for the demodulator mixer or demod 304 from the relationship between the phase and the offset change where the offset change is approximately zero. Alternatively, phase estimation can be accomplished with two different phase angles and two different quadrature states, and the relations between quantities can be related via a system of equations to compute the estimating $\varphi_{ideal}$ as the best phase for the demodulator mixer or demod 304.

Figure 7:
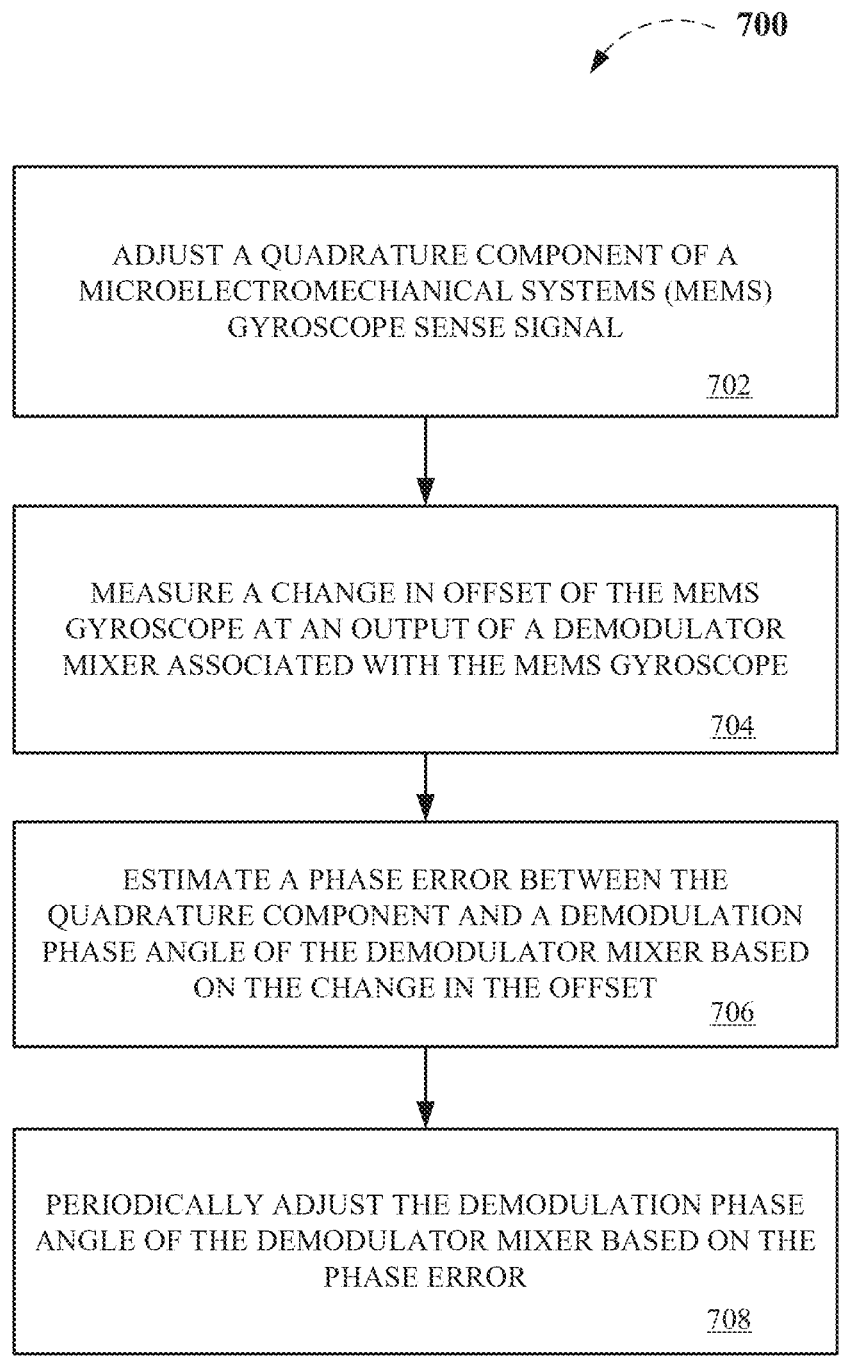
FIG. 7 depicts an exemplary flowchart of non-limiting methods associated with exemplary MEMS gyroscopes and calibration thereof, according to various non-limiting aspects of the disclosed subject matter.

In view of the subject matter described supra, methods that can be implemented in accordance with the disclosed subject matter will be better appreciated with reference to the flowcharts of FIG. 7. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and/orders of the blocks, can be implemented which achieve the same or a similar result. Moreover, not all illustrated blocks may be required to implement the methods described hereinafter.

Exemplary Methods

FIG. 7 depicts an exemplary flowchart of non-limiting methods 700 associated with exemplary MEMS gyroscopes and calibration thereof, according to various non-limiting aspects of the disclosed subject matter. For instance, exemplary methods 700 can comprise, at 702, adjusting a quadrature component of an exemplary MEMS gyroscope 102 sense signal, for example, as further described herein, regarding FIGS. 1-6. As a non-limiting example, adjusting the quadrature component of the exemplary MEMS gyroscope 102 sense signal can comprise increasing or decreasing a voltage applied to the exemplary MEMS gyroscope 102, according to various non-limiting aspects described herein, regarding FIGS. 1-6.

In addition, exemplary methods 700 can comprise, at 704, measuring a change in offset of the exemplary MEMS gyroscope 102 at an output of a demodulator mixer (e.g., demodulator mixer 208, demodulator mixer or demod 304, etc.) associated with the exemplary MEMS gyroscope 102, for example, as further described herein, regarding FIGS. 1-6.

Exemplary methods 700 can further comprise, at 706, estimating a phase error between the quadrature component and a demodulation phase angle of the demodulator mixer (e.g., demodulator mixer 208, demodulator mixer or demod 304, etc.) based on the change in the offset, for example, as further described herein, regarding FIGS. 1-6.

In addition, exemplary methods 700 can comprise, at 708, periodically adjusting the demodulation phase angle of the demodulator mixer (e.g., demodulator mixer 208, demodulator mixer or demod 304, etc.) based on the phase error, for example, as further described herein, regarding FIGS. 1-6. As a non-limiting example, periodically adjusting the demodulation phase angle of the demodulator mixer (e.g., demodulator mixer 208, demodulator mixer or demod 304, etc.) can comprise trimming the demodulation phase angle based on a demodulation phase angle estimation at the output of the demodulation mixer that results in an approximately zero change in offset, wherein the demodulation phase angle estimation is within a predetermined variation of demodulation phase angle for the exemplary MEMS gyroscope 102, according to various non-limiting aspects described herein, regarding FIGS. 1-6.

What has been described above includes examples of the embodiments of the disclosed subject matter. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in disclosed subject matter for illustrative purposes, various modifications are possible that are considered within the scope of such embodiments and examples, as those skilled in the relevant art can recognize.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements. Numerical data, such as voltages, ratios, and the like, are presented herein in a range format. The range format is used merely for convenience and brevity. The range format is meant to be interpreted flexibly to include not only the numerical values explicitly recited as the limits of the range, but also to include all the individual numerical values or sub-ranges encompassed within the range as if each numerical value and sub-range is explicitly recited. When reported herein, any numerical values are meant to implicitly include the term "about." Values resulting from experimental error that can occur when taking measurements are meant to be included in the numerical values.

What is claimed is:

1. A method, comprising:
   adjusting a quadrature component of a microelectromechanical systems (MEMS) gyroscope sense signal;
   measuring a change in offset of the MEMS gyroscope at an output of a demodulator mixer associated with the MEMS gyroscope; and
   estimating a phase error between the quadrature component and a demodulation phase angle of the demodulator mixer based at least in part on the change in the offset.

2. The method of claim 1, further comprising:
   periodically adjusting the demodulation phase angle of the demodulator mixer based at least in part on the phase error.

3. The method of claim 2, wherein the periodically adjusting the demodulation phase angle of the demodulator mixer comprises trimming the demodulation phase angle based on a demodulation phase angle estimation at the output of the demodulation mixer that results in an approximately zero change in offset, wherein the demodulation phase angle estimation is within a predetermined variation of demodulation phase angle for the MEMS gyroscope.

4. The method of claim 1, wherein the adjusting the quadrature component of the MEMS gyroscope sense signal comprises increasing or decreasing a voltage applied to the MEMS gyroscope.

5. An apparatus, comprising:
   a quadrature injection component configured to adjust a quadrature component of a microelectromechanical systems (MEMS) gyroscope sense signal;
   a measurement component configured to measure a change in offset of the MEMS gyroscope at an output of a demodulator mixer associated with the MEMS gyroscope; and
   an error component configured to estimate a phase error between the quadrature component and a demodulation phase angle of the demodulator mixer based at least in part on the change in the offset.

6. The apparatus of claim 5, wherein the quadrature injection component is further configured to increase or decrease a voltage applied to the MEMS gyroscope.

7. The apparatus of claim 5, further comprising:
   a demodulation phase control component configured to periodically adjust the demodulation phase angle of the demodulator mixer based at least in part on the phase error.

8. The apparatus of claim 7, wherein the demodulation phase control component is further configured to trim the demodulation phase angle based on a demodulation phase angle estimation at the output of the demodulation mixer that results in an approximately zero change in offset, wherein the demodulation phase angle estimation is within a predetermined variation of demodulation phase angle for the MEMS gyroscope.

9. The apparatus of claim 8, further comprising:
a phase estimation component configured to determine the demodulation phase angle estimation at the output of the demodulation mixer that results in the approximately zero change in offset.

10. A system comprising:
a microelectromechanical systems (MEMS) gyroscope;
a complementary metal oxide semiconductor (CMOS) associated with the MEMS gyroscope;
a quadrature injection component configured to adjust a quadrature component of a sense signal of the MEMS gyroscope;
a demodulator mixer of the CMOS configured to output a Coriolis signal of the MEMS gyroscope and suppress the quadrature component of the sense signal of the MEMS gyroscope;
a measurement component of the CMOS configured to measure a change in offset of the MEMS gyroscope at an output of the demodulator mixer;
an error component configured to estimate a phase error between the quadrature component and a demodulation phase angle of the demodulator mixer based at least in part on the change in the offset;
a phase estimation component configured to estimate the demodulation phase angle at the output of the demodulator mixer that results in an approximately zero change in offset; and
a demodulation phase control component configured to periodically adjust the demodulation phase angle of the demodulator mixer based at least in part on the phase error or the estimate of the demodulation phase angle to output the Coriolis signal of the MEMS gyroscope and to suppress the quadrature signal of the MEMS gyroscope.

11. The system of claim 10, wherein the quadrature injection component is further configured to increase or decrease a voltage applied to the MEMS gyroscope.

12. The system of claim 10, wherein the estimate of the demodulation phase angle at the output of the demodulator mixer is within a predetermined variation of demodulation phase angle for the MEMS gyroscope.

13. An apparatus, comprising:
means for adjusting a quadrature component of a microelectromechanical systems (MEMS) gyroscope sense signal;
means for measuring a change in offset of the MEMS gyroscope at an output of a demodulator mixer associated with the MEMS gyroscope;
means for estimating a phase error between the quadrature component and a demodulation phase angle of the demodulator mixer associated with the MEMS gyroscope based at least in part on the change in the offset; and
means for periodically adjusting the demodulation phase angle of the demodulator mixer based at least in part on the phase error.

14. The apparatus of claim 13, wherein the means for adjusting the quadrature component of the MEMS gyroscope sense signal comprises means for increasing or decreasing a voltage applied to the MEMS gyroscope.

15. The apparatus of claim 13, wherein the means for periodically adjusting the demodulation phase angle of the demodulator mixer comprises means for trimming the demodulation phase angle based on a demodulation phase angle estimation at the output of the demodulation mixer that results in an approximately zero change in offset, wherein the demodulation phase angle estimation is within a predetermined variation of demodulation phase angle for the MEMS gyroscope.

* * * * *